United States Patent [19]

Gardner

[11] Patent Number: 5,448,204
[45] Date of Patent: Sep. 5, 1995

[54] FREQUENCY CORRELATED PRECISION CURRENT REFERENCE

[75] Inventor: Richard A. Gardner, Bedford, Mass.

[73] Assignee: The Charles Stark Draper Laboratory, Inc., Cambridge, Mass.

[21] Appl. No.: 109,224

[22] Filed: Aug. 19, 1993

[51] Int. Cl.[6] .................... H03L 7/099; G05F 1/12
[52] U.S. Cl. .................... 331/25; 331/34; 323/234; 327/108
[58] Field of Search .............. 331/25, 34; 323/234; 327/108

[56] References Cited

U.S. PATENT DOCUMENTS 3,895,312  7/1975  Tipon .................................. 331/25
4,862,015  8/1989  Grandfield ........................ 331/1 R

OTHER PUBLICATIONS

Sidney Soclof, *Analog Integrated Circuits*, Prentice-Hall, Inc., Englewood Cliffs, N.J. (1985) pp. 468–471.

Primary Examiner—Siegfried H. Grimm
Attorney, Agent, or Firm—Lappin & Kusmer

[57] ABSTRACT

A precision current source for providing a stable reference current wherein the current source comprises a reference oscillator and a frequency-to-current conversion network. The frequency-to-current conversion network includes a phase detector, a filter, and a ferrimagnetic resonant oscillator. The phase detector generates an error signal representative of a difference in phase angle between a first signal coupled to a first input terminal and a second signal coupled to a second input terminal. The reference oscillator provides a periodic reference signal to the first input terminal. The filter generates a current reference signal representative of a substantially dc portion of the error signal. The ferrimagnetic resonant oscillator receives the current reference signal from the filter, generates a periodic feedback signal having a frequency representative of the magnitude of the current reference signal, and couples that feedback signal to the second input of the phase detector.

5 Claims, 2 Drawing Sheets

FREQUENCY CORRELATED PRECISION CURRENT REFERENCE

BACKGROUND

The present invention relates to precision current references. More particularly, the invention relates to a network for generating a precision current reference that remains stable in high radiation environments.

Precision current references are used in a variety of electronic instruments, such as dynamically tuned gyroscopes (DTGs), interferometric fiber optic gyroscopes (IFOGs), force rebalance accelerometers, electromagnetically torqued gyros, and other inertial instruments requiring precision current excitation. Precision current references are also utilized in analog-to-digital (A/D) converters, digital-to-analog (D/A) converters, and precision laboratory test equipment.

Many devices, such as those listed above, must be capable of operating reliably in high radiation environments (i.e. greater than approximately $10^{13}$ n/cm$^2$ and greater than 1 Mrad (Si) ionizing dose. Those devices typically require precision current references with stability ratings of better than one part per million (ppm) under high radiation conditions. Presently, there are no current references that meet this requirement. The present state-of-the-art radiation hardened references shift approximately ten ppm in high radiation environments.

Prior art current references include a variety of approaches. One approach is to use a precision voltage reference and then employ a transconductance stage to convert the voltage reference to a current reference. Typically, the voltage reference utilizes the reverse breakdown and/or the forward voltage characteristics of semiconductor diodes. It may also rely upon the bandgap voltage characteristics of a matched transistor pair.

Semiconductor diode and transistor implementations suffer from several drawbacks. One drawback is that the transconductance stage tends to degrade the performance of the current reference. Another drawback is that diode and transistor implementations require high quality single crystal semiconductor materials to achieve acceptable performance. However, the use of single crystal materials is problematic because exposure to neutron or proton radiation results in minority carrier lifetime changes caused by damage to the semiconductor crystal lattice. Another drawback is that the performance of diode based references are dependent upon small variations in the avalanche and tunneling current balance to achieve both temperature and radiation stability. Since the balance is dependent upon achieving a small difference between two large valued compensating mechanisms, avalanche and tunneling, these devices tend not to be sufficiently stable for precision applications in high radiation environments.

Some diode and transistor based devices attempt to circumvent this problem by pre-irradiating the devices at high neutron fluences. However, this tends to be expensive and is only partially effective.

An alternate prior art approach derives a precision current source from the negative resistance characteristics of degenerately doped semiconductor materials. A significant problem with this approach is that degenerately doped semiconductors suffer from electrical instability. This instability results from the negative resistance characteristics of the highly doped devices. Additionally, these devices are difficult and expensive to manufacture.

Another prior art approach relies on the volt-time product of square loop magnetic materials. Like the diode and transistor references, these devices require a transconductance stage to convert a voltage reference to a current reference. An additional drawback is that square loop magnetic materials have unacceptably high temperature coefficients. Some magnetic based devices, such as Superconducting Quantum Interference Devices (SQUIDs), avoid the temperature coefficient problem by operating at cryogenic temperatures. However, those devices are relatively large and heavy, rendering them impractical for many applications.

An alternate prior art approach utilizes self biased field effect transistors (FETs) to realize current regulator diodes. These devices are dependent upon both device geometry and on semiconductor doping levels. Moreover, they are sensitive to temperature variations and radiation exposure, both of which change leakage currents and effect the FET transconductance characteristic.

A general disadvantage to all of the above approaches, excluding the constant current diodes, is that they all require multiple precision support components. These components include precision operational amplifiers, precision resistors and high stability analog switches. The support components are typically employed to either excite the reference or to perform voltage to current conversions. The development of precision support components, to meet sub-ppm performance requirements, is difficult and costly, especially when operation is required in a high radiation environment.

By way of example, an operational amplifier, used to buffer a conventional precision voltage reference, must have an offset voltage stability of one microvolt to realize a one volt reference that is stable to within one ppm. Present state-of-the-art monolithic radiation hard operational amplifiers have offset voltage shifts in the range of ten to one hundred microvolts. Additionally, operational amplifier open loop gain changes of as little as six decibels cause ten to forty ppm errors for common inverting and non-inverting configurations.

Furthermore, the magnitude of the precision current in prior art devices is fixed. Real time control of the current magnitude requires additional complex, precision electronic components. Those components tend to further degrade the current reference performance.

Accordingly, it is an object of the present invention to provide a current reference that is stable when operating in a high radiation environment.

A further object of the invention is to provide an improved adjustable precision current reference.

Other objects, features, and advantages of the invention will be apparent from the following figures, description of the preferred embodiments thereof, and from the claims.

SUMMARY OF THE INVENTION

This invention relates to a precision current reference. More particularly, it relates to a network for providing reference current that remains stable in a high radiation environment. According to one embodiment, the current source employs a phase-lock-loop architecture, and includes a phase detector, a reference oscillator, a low-pass filter, and a ferrimagnetic resonant oscillator.

The phase detector has a first input terminal, a second input terminal, and an output terminal, and generates an error signal at the output terminal representative of a difference in phase angle between a first signal coupled to the first input terminal and a second signal coupled to the second input terminal. The low-pass filter couples to the output terminal of the phase detector, and generates a reference signal representative of a substantially dc portion of the error signal generated by the phase detector.

The reference oscillator provides a stable periodic reference signal at the first input terminal of the phase detector. According to one embodiment, the stability of the current source with respect to neutron and proton radiation is improved by employing a crystal reference oscillator.

The ferrimagnetic resonant oscillator has an input terminal for receiving the current reference signal and an output terminal coupled to the second input terminal of the phase detector. The oscillator generates, at its output terminal, a periodic feedback signal having a frequency representative of the magnitude of the current reference signal. According to one embodiment, the ferrimagnetic resonant oscillator is constructed from Yttrium-Iron-Garnet (YIG). Alternately, it can be constructed from gallium-substituted YIG, lithium ferrite, barium ferrite, or other rare earth doped ferrites. Ferrimagnetic materials, such as YIG, gallium-substituted YIG, lithium ferrite, and barium ferrite are inherently stable in high radiation environments. Thus, by utilizing an oscillator based upon those materials to generate the periodic feedback signal, the current source is rendered additionally impervious to radiation.

The precision current reference can also be programmable. According to one embodiment, the current reference further comprises a programmable divider, coupled between the ferrimagnetic resonant oscillator and the phase detector. The programmable divider divides the frequency of the periodic feedback signal by an integer factor (n) in response to an externally generated scaling command. Alternately, the programmable divider can be coupled between the reference oscillator and the phase detector.

Thus, the invention provides a precision current reference that remains stable in high radiation environments and that can be programmed to yield a plurality of reference current levels.

BRIEF DESCRIPTION OF THE DRAWINGS

For a fuller understanding of the nature and objects of the invention, reference is to be made to the following detailed description and the accompanying drawings, in which.

Like reference characters in the respective drawn figures indicate corresponding parts.

DESCRIPTION OF THE PREFERRED EMBODIMENT

A precision current reference, according to the invention, couples a reference oscillator to a frequency-to-current conversion stage through a phase-locked-loop architecture. According to one embodiment, the invention utilizes a crystal reference oscillator in combination with a frequency-to-current conversion stage constructed from ferrimagnetic resonant materials to render the current reference substantially invariant in high radiation environments.

Figure 1:
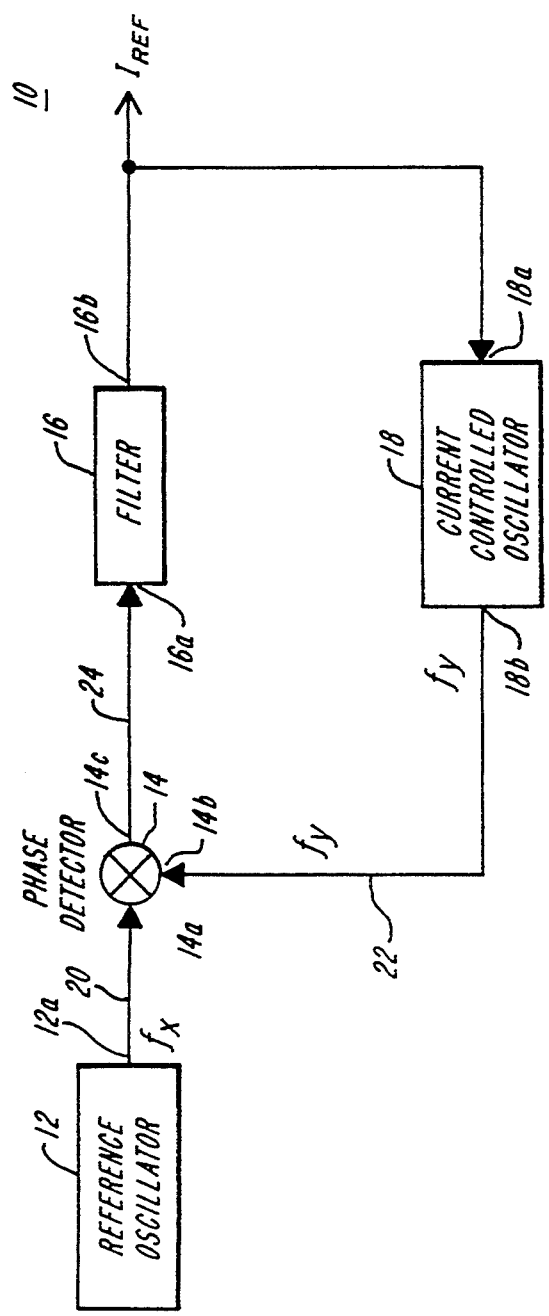
FIG. 1 is a block diagram of a precision current reference according to the invention.

FIG. 1 shows a block diagram of a frequency correlated precision current reference 10 according to the invention. The current reference 10 includes a reference oscillator 12, a phase detector 14, a filter 16, and a current controlled oscillator 18, connected in a phase-locked-loop (PLL) configuration.

The PLL configuration of FIG. 1 produces a reference current $I_{ref}$. In the PLL configuration, the stability of $I_{ref}$ is primarily dependent upon the stability of the reference oscillator 12 and on the stability of the current-to-frequency transfer coefficient $K_i$ of the current controlled oscillator 18. The reference oscillator 12 generates, at the output terminal 12a, a signal on line 20 having an oscillation frequency $f_x$. The reference oscillator 12 couples the signal on line 20 into the phase detector 14 via the phase detector input terminal 14a. The phase detector 14 compares the phase angle of the signal on line 20 with the phase angle of the signal on line 22. The signal on line 22 couples to the phase detector input terminal 14b by way of the current controlled oscillator output terminal 18b. The phase detector 14 compares the signals at the terminals 14a and 14b and produces, at its output terminal 14c, an error signal on line 24 that is representative of the difference between the phase angle of the signal on line 20 and the phase angle of the signal on line 22. The error signal (I) on line 24 is given by $$I = K_\phi(\phi)$$

where $K_\phi$ is the gain of the phase detector 14, and $\phi$ is the phase angle difference between the signal on line 20 and the signal on line 22.

The phase detector 14 couples the error signal on line 24 into the filter 16 by way of the filter input terminal 16a. The filter 16 removes the high frequency components, such as those at the reference oscillator frequency $f_x$ and the current controlled oscillator frequency $f_y$, from the signal on line 22 and produces at its output terminal 16b an essentially dc current reference signal ($I_{ref}$). The filter 16 couples the signal $I_{ref}$ back to the current controlled oscillator 18 by way of the oscillator input terminal 18a. The filter 16 can also employ a gain stage for scaling the input to the current controlled oscillator 18.

$I_{ref}$ acts on the current controlled oscillator 18 to shift the frequency of the oscillator output signal on line 22 from the zero-current frequency $f_c$ to the frequency $f_y$. The current controlled oscillator 18 in turn couples the signal on line 22 from its output terminal 18b into the input terminal 14b of the phase detector 14.

$f_y$ is given by $$f_y = f_c + K_i I_{ref}$$

where $K_i$ is the current-to-frequency transfer coefficient of the current controlled oscillator 18.

The precision current reference 10 is said to be in lock when $$f_x = f_y = f_c + K_i I_{ref}$$

and the phase difference between $f_x$ and $f_y$ is stabilized. Thus, $$I_{ref} = (f_x - f_c)/K_i.$$

As can be seen from the above discussion, the PLL architecture of network 10 locks the current controlled oscillator output signal $f_y$ to the reference oscillator output signal $f_x$. Consequently, the stability of $f_y$ tracks the stability of the output of $f_x$, regardless of any offsets in the phase detector 14 or in the filter 16. Also, the overall stability of the output signal $I_{ref}$ tracks the stability of the $f_x$ and the stability of the current-to-frequency transfer coefficient $K_i$ of the current controlled oscillator 18. Thus, by constructing both the reference oscillator 12 and the current controlled oscillator 18 from materials that remain stable in high radiation environments, the invention can provide a current reference that remains substantially invariant in such an environment.

By way of example, the nuclear radiation stability of properly designed crystal oscillators is significantly better than one ppm. Additionally, due to the fundamental quantum mechanical properties of certain ferrimagnetic materials such as YIG, gallium-substituted YIG, lithium ferrite, barium ferrite, and other rare earth doped ferrites, those materials are substantially unaffected by a high radiation environment. Therefore, according to one preferred embodiment, the reference oscillator 12 is a crystal-based oscillator. According to a further embodiment, the current controlled oscillator 18 is constructed from materials such as YIG, gallium-substituted YIG, lithium ferrite, barium ferrite, or other rare earth doped ferrites.

Thus, by utilizing a crystal oscillator 12 in combination with a current controlled oscillator 18 constructed from such ferrimagnetic materials, the invention can provide a current reference signal $I_{ref}$ that remain stable to within one ppm in a high radiation environment.

Figure 2:
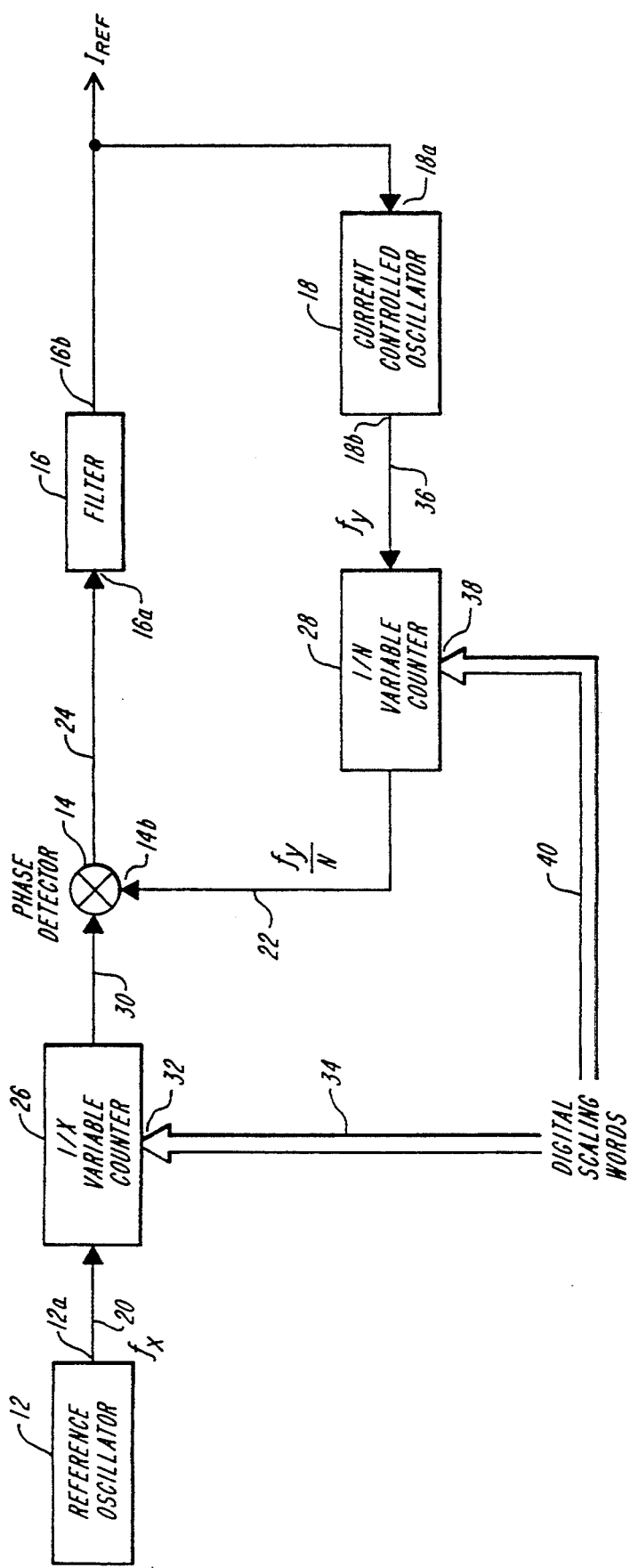
FIG. 2 is a block diagram of the precision current reference depicted in FIG. 1 further including programmable scaling counters.

FIG. 2 shows an alternate embodiment of the current reference 10 of FIG. 1 that further includes the scaling counters 26 and 28. The scaling counter 26 couples between the reference oscillator output terminal 12a and the phase detector input terminal 14a. The counter 26 divides the frequency of the reference oscillator output signal $f_x$ on line 20 by an integer factor X to produce a scaled reference signal on line 30. The frequency of the scaled reference signal is equal to $$f_x/X.$$

The scaling counter 26 also includes digital control inputs 32. The digital control inputs 32 are responsive to external control signals 34 for programming a plurality of integer scaling factors X.

A second scaling counter 28 couples between the output terminal 18b of the current controlled oscillator 18 and the input terminal 14b of the phase detector 14. The scaling counter 28 divides the frequency of the signal $f_y$ on line 36 by an integer factor N to scale the signal on line 22 to have a frequency equal to $$f_y/N.$$

Similarly to the scaling counter 26, the counter 28 also includes digital control inputs 38, responsive to external control signals 40, for programming a plurality of integer scaling factors N.

With respect to the alternate embodiment of FIG. 2, the output reference current $I_{ref}$ is given by $$I_{ref} = [(N/X)f_x - f_c]/K_i$$

Consequently, the addition of the scaling counters 26 and 28 render the output current $I_{ref}$ readily adjustable, while avoiding using any additional precision analog components.

Other techniques to modify the feedback frequency, such as heterodyning and frequency synthesis, also permit variable digital scaling of the reference current $I_{ref}$.

As in the case of FIG. 2, the current controlled oscillator 18 can be implemented utilizing ferrimagnetic materials such as YIG, gallium-substituted YIG, lithium ferrite, barium ferrite, or other rare earth doped ferrites, and the reference oscillator 12 can be of the crystal oscillator type, further improving the current reference's overall stability with respect to neutron and proton radiation.

The invention may be embodied in other specific forms without departing from the spirit or essential characteristics thereof. The current embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed is:

1. A precision current source for providing a stable reference current, said current source comprising,
  A. phase detector means, having a first input terminal, a second input terminal, and an output terminal, and including means for generating an error signal at said output terminal representative of a difference in phase angle between a first signal coupled to said first input terminal and a second signal coupled to said second input terminal,
  B. a reference oscillator, including means for generating a stable periodic reference signal at said first input terminal of said phase detector,
  C. a filter coupled to said output terminal of said phase detector, and including means for generating a current reference signal representative of a substantially dc portion of said error signal, and
  D. a ferrimagnetic resonant oscillator, having an input terminal for receiving said current reference signal and an output terminal coupled to said second input terminal of said phase detector, and including current controlled oscillator means for generating at said output terminal a periodic feedback signal having a frequency representative of the magnitude of said current reference signal.

2. A precision current source according to claim 1 wherein said reference oscillator is a crystal oscillator.

3. A precision current source according to claim 1 wherein said ferrimagnetic resonant oscillator is constructed from Yttrium-Iron-Garnet.

4. A precision current source according to claim 1 wherein said current source further comprises magnitude selection means for selecting the magnitude of said reference current, said magnitude selection means including, a first programmable divider, coupled between said ferrimagnetic resonant oscillator and said phase detector, said programmable divider including means for dividing said frequency of said periodic feedback signal by an integer factor (n) in response to an externally generated scaling command.

5. A precision current source according to claim 4 wherein said magnitude selection means further includes a second programmable divider, coupled between said reference oscillator and said phase detector, said programmable divider including means for dividing said frequency of said periodic reference signal by an integer factor (x) in response to said externally generated scaling command.

* * * * *